United States Patent [19]
Bacher

[11] 3,821,611
[45] June 28, 1974

[54] CROSS CONDUCTORS WITH DOUBLE LAYERED INSULATION

[75] Inventor: Rudolph John Bacher, New Castle, Del.

[73] Assignee: E. I. du Pont de Nemours and Company, Wilmington, Del.

[22] Filed: Sept. 21, 1973

[21] Appl. No.: 399,726

[52] U.S. Cl. .......... 317/101 CE, 117/217, 161/196, 252/308, 338/308, 317/101 A
[51] Int. Cl. .......... H05k 1/04
[58] Field of Search .. 117/217; 317/101 A, 101 CE, 317/258; 338/254, 308; 161/196; 156/90; 252/63.2

[56] References Cited

UNITED STATES PATENTS

| | | | |
|---|---|---|---|
| 3,305,394 | 2/1967 | Kaiser | 117/217 |
| 3,374,110 | 3/1968 | Miller | 117/217 |
| 3,560,256 | 2/1971 | Abrams | 317/101 CE |

*Primary Examiner*—E. A. Goldberg

[57] ABSTRACT

The present disclosure relates to thick film dielectric layers which exhibit low dielectric constants and reduced tendency to permit sinking of the top electrode into the dielectric during firing, the dielectrics having two layers. The first layer is a borosilicate glass layer with an optional additional phase of finely divided silica, and the second layer is a glass ceramic. The dielectrics are useful in multilayer circuitry, especially as cross-over dielectrics.

9 Claims, 3 Drawing Figures

CROSS CONDUCTORS WITH DOUBLE LAYERED INSULATION

BACKGROUND OF THE INVENTION

This invention relates to electronics, and more particularly, to dielectric layers in multilayer thick film structures.

Thick film electronic structures are prepared by printing (screen or stencil techniques) a paste or dispersion of inorganic powders on a dielectric substrate, then firing the printed substrate to sinter or cure the printed pattern and form the desired electronic function. The paste may be a conductor, resistor, thermistor, dielectric, etc., composition. Multilayer thick film structures may be formed by sequentially printing a series of conductor and dielectric layers on a substrate and firing them. A specific embodiment is that obtained by printing a first or bottom conductor pattern (electrode) on the substrate, then a dielectric pad over part of the electrode, and then a second or top electrode on the substrate which crosses over the bottom pattern at the dielectric pad. All the layers may be cofired, or the layers may be fired sequentially, if desired.

The aforementioned dielectric pad is printed with a composition referred to as "crossover dielectric composition." A crossover dielectric composition is essentially a low dielectric constant insulator capable of separating two conductor patterns through several firing steps. High melting, viscous glasses have been used as the dielectric, so that the firing of the top conductor line can be carried out at a temperature below that at which softening of the dielectric occurs. Melting or softening of the crossover dielectric is accompanied by shorting of the two conductor patterns against each other, with subsequent failure of the electrical circuit. Cracking and peeling of the top conductor also frequently occurs. The major requirement for a crossover dielectric is control of resoftening or thermoplasticity in the top conductor firing step. Other property requirements are low dielectric constant, to prevent A.C. capacitance coupling between insulated circuits; low electric loss (high Q-value), to avoid dielectric heating; reduced "pinholding" tendency; reduced tendency to envolve gas during firing; proper glass (or glass-ceramic precursor) softening temperature so that the initial firing is adaptable to the thick film firing process (typically below 1000° C.); good resistance to thermal shock crazing; and low sensitivity to water vapor and subsequent electrical losses.

Glass ceramics have recently been used as crossover dielectric compositions. A glass-ceramic is a ceramic prepared by the partial crystallization of a glass in situ. This crystallization usually contemplates the addition of a nucleating or crystallization-promoting agent to a glass-forming batch, melting the batch, simultaneously shaping and cooling the melt into a glass (noncrystalline) body, and thereafter heat treating the resultant body to cause the glass body to be converted into a body composed of fine-grained crystals randomly dispersed substantially uniformly throughout a glassy matrix. The crystals comprise a major portion of the body (at least 20 percent by weight). The crystalline makeup of the body usually results in physical properties differing considerably from those of the original glass body. However, because it was originally a glass, the body can be formed into almost any configuration using conventional methods of shaping glass.

Such glass-ceramics are those disclosed in Hoffman U.S. Pat. Nos. 3,586,522, issued June 22, 1971, and 3,656,984, issued Apr. 18, 1972. However, as disclosed in the Hoffman patents (Example 23), a dielectric constant of above 13 is often obtained with such glass-ceramic crossovers. Such high K's are often unacceptable in some uses. Therefore, crossover dielectrics are desired which have good physical properties in terms of reduced electrode sinking (during firing) and lower dielectric constants. Electrode sinking is to be minimized or avoided, since sinking results in higher capacitance, reduced solderability of the top electrode, possibility of shorting of conductors, and lower insulation resistance.

SUMMARY OF THE INVENTION

The present invention provides a multilayer thick film electronic structure comprising a novel two-layer dielectric layer between two conductor or electrode patterns. Where a crossover dielectric is involved, it appears at at least one position where the conductors (electrodes) cross over one another. Two different dielectric compositions are used, one printed over the other. The resultant crossover dielectric can exhibit both a low dielectric constant (below 7, and often in the range 4–7) and reduced top electrode sinking, that is, the top electrode does not sink into the dielectric upon firing of the top electrode.

In multilayer electronic structures comprising, as sequential layers on a ceramic dielectric substrate, a bottom electrode on and adherent to said substrate, a dielectric layer over and adherent to at least part of said bottom electrode, and a top electrode which over and adherent to at least part of said dielectric layer (and hence on "top" of said bottom electrode), this invention provides improved multilayer structures wherein the dielectric layer itself comprises two sub-layers: (A) a sub-layer adjacent to the bottom electrode which comprises 5–100 percent of a borosilicate glass, which glass comprises at least 55 percent $SiO_2$ and at least 5 percent $B_2O_3$, the remainder of the borosilicate glass being one or more other glass-forming compounds, and as a separate phase 0–95 percent free $SiO_2$ and adherent to (A), (B) a dielectric sub-layer adjacent to the top electrode, wherein (B) is a glass-ceramic containing at least 20 percent crystals dispersed in a glassy matrix. By free silica in sub-layer (A) I mean silica which is not part of the glass, but rather unbound or unfritted. It may be either amorphous or crystalline silica. The dielectric layer may cover part or all of the bottom electrode, or even overlap the edges of the bottom electrode and cover part of the substrate as well. The top electrode may cover part or all of the dielectric layer; if the dielectric overlaps one or more vertical edges of the bottom electrode, the top electrode may cover the dielectric layer at those locations. The dielectric layers of the present invention are hence most useful in making crossover dielectrics.

Preferred are multilayer structures wherein dielectric sub-layer (A) comprises a borosilicate glass of at least 60 percent $SiO_2$ and at least 10 percent $B_2O_3$. Also preferred are multilayer structures wherein dielectric sub-layer (A), in addition to that borosilicate glass, comprises about 10–30 percent by weight $SiO_2$, as a separate phase.

More preferred are multilayer structures wherein dielectric sub-layer (A) comprises both said preferred borosilicate glass (at least 60 percent $SiO_2$ and at least 10 percent $B_2O_3$) and about 10–30 percent by weight $SiO_2$, as a separate phase.

Preferred multilayer structures are also those wherein dielectric sub-layer (B) is a glass-ceramic prepared by firing (to cause partial crystallization) a glass consisting essentially of (by weight) the materials and properties set forth in Tables I and/or II. Among these glasses in the Tables, preferred glasses are stated.

Table II

GLASS COMPOSITIONS (Weight Percent)

| Component | Operable | Preferred |
|---|---|---|
| $SiO_2$ | 20–38 | 22–32 |
| PbO | 21–45 | 22–42 |
| $Al_2O_3$ | 1–25 | 9–13 |
| $TiO_2$ | 2–20 | 3–15 |
| BaO | 2–15 | 4–12 |
| ZnO | 0–25 | 0–20 |
| $PbF_2$ | 0–15 | 0–10 |
| SrO | 0–5 | 0–4 |
| $ZrI_2$ | 0–5 | 0–4 |
| $Ta_2O_5$ | 0–5 | 0–4 |
| $WO_3$ | 0–5 | 0–4 |
| CdO | 0–5 | 0–4 |
| $SnO_2$ | 0–5 | 0–4 |
| $Sb_2O_3$ | 0–5 | 0–4 |

TABLE II

GLASS COMPOSITIONS (Weight Percent)

| Component | Operable | Preferred | Optimum |
|---|---|---|---|
| $SiO_2$ | 25–40% | 30–33% | 30% |
| $TiO_2$ | 5–15% | 8–10% | 8–10% |
| $Al_2O_3$ | 7–12% | 10–12% | 10% |
| BaO | 10–30% | 12–26% | 26% |
| ZnO | 10–26% | 10–26% | 10–12% |
| CaO | 2–10% | 6–10% | 6–10% |
| $B_2O_3$ | 2– 8% | 2– 8% | 4% |
| MgO | 0– 2% | 0– 2% | 2% |
| $Bi_2O_3$ | 0– 4% | 0– 4% | — |
| Total BaO plus ZnO | 30–40% | 30–40% | 36–38% |

BRIEF REFERENCE TO THE DRAWING

In the Drawing:

FIG. 1 is a schematic overhead view of a multilayer electronic structure comprising the following layers printed on dielectric substrate 1: bottom electrode 2, intermediate dielectric layer 5, and top electrode 3;

FIG. 2 is a cross-sectional view of the multilayer structure of FIG. 1, taken along the line 1—1 in FIG. 1, showing that the top dielectric layer 5 covers another dielectric layer 4; and FIG. 3 is a cross-sectional view of a multilayer structure similar to that of FIGS. 1 and 2, except that the top dielectric layer 5 completely overlape three sides of dielectric layer 4.

DETAILED DESCRIPTION

The fired dielectrics of the present invention achieve a desired balance of physical characteristics, including a dielectric constant (K) approaching that of a low dielectric constant borosilicate glass layer and a physical appearance (and hence reduced tendency to permit top electrode sinking) equal to that of a glass-ceramic dielectric layer. Provided that there is no interaction of the respective dielectric layers during firing of this invention, the dielectric constant of the resultant two layer fired dielectric is $$K_t = 2\ K_1\ K_2/(K_1 + K_2),$$

where $K_t$ = total $K$ $K_1$ = $K$ of first layer $K_2$ = $K$ of second layer.

The composition of the materials used to produce the respective layers in the dielectrics of the present invention is important, in the sense that, prior to firing the compositions of the present invention are a borosilicate glass for the bottom layer and a glass-ceramic precursor for the top layer.

Figure 3:
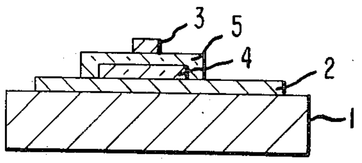

The composition used to print the bottom layer may optionally comprise, prior to firing, a second phase of finely divided silica, in addition to the above-described glass phase. The silica may be amorphous (fused) or crystalline. The amount of silica may be 0–95 percent by weight of the composition used to print the bottom layer, depending upon the porosity desired. At least 5 percent glass phase is present to provide adhesion to the substrate. Where a large amount of this second phase of silica is used (e.g., more than 30 percent), it is important that the top dielectric layer be printed to completely overlap the bottom dielectric layer. In this connection see top layer 5 overlapping the top and sides of bottom dielectric layer 4 in FIG. 3.

The preferred amount of second phase silica in the composition used to print the bottom layer is about 10–30 percent by weight of the total glass plus silica, the optimum amount is about 20 percent. The silica is crystalline or amorphous.

The essential component of the composition used to print the first or bottom dielectric layer, the borosilicate glass, comprises at least 55 percent $SiO_2$, and at least 5 percent $B_2O_3$, the remainder being one or more conventional glass-forming materials known to the art. In forming the glass by conventional melting techniques, these materials may be supplied to the glass-forming batch as the oxide or as precursors thereof (e.g., $B_2O_c$ as $H_3BO_3$, etc.). Such typical glass formers include, for instance, CaO, $Al_2O_3$, MgO, $K_2O$, $Na_2O$, etc. Preferred borosilicates glasses comprise at least 60% $SiO_2$ and 10% $B_2O_3$. Optimum borosilicate glasses contain (a) about 70% $SiO_2$ and 30% $B_2O_3$ with only small amounts of other materials or (b) 50–75% $SiO_2$, 5–25% $B_2O_3$, 0–25% CaO, 0–25% $Al_2O_3$, 0–10% MgO, 0– 3% $K_2O$ and 0–3% $Na_2O$.

Upon firing, there results silica particles in a matrix of a borosilicate glass.

The partially crystallizable glass (glass-ceramic precursor) used to print the second (top) dielectric layer is also prepared by conventional glass batch melting techniques from the desired components or precursors thereof. The glass may be any of those known to the art, which produce in situ at least about 20 percent crystals (preferably 20–48 percent) in a glassy matrix, upon being heated, including those of Hoffman U.S. Pat. Nos. 3,586,522, issued June 22, 1971, and 3,656,984, issued Apr. 18, 1972, and commonly assigned Amin U.S. Pat. No. 3,785,837 issued Jan. 15, 1974; the disclosures of the Hoffman patents and Amin application are incorporated by reference herein.

The compositions used in the present invention comprise finely divided inorganic powders dispersed in inert vehicles. The powders are sufficiently finely divided to be used in conventional screen or stencil printing operations, and to faciliate sintering. Generally, the powders are such that they pass through a 325-mesh screen (44 micron openings), U.S. standard sieve scale.

The compositions are prepared from the solids and vehicles by mechanical mixing. The compositions are printed as a film onto ceramic dielectric substrates in the conventional manner. Generally, screen or stencil printing techniques are preferably employed.

Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of inert liquid vehicle to solids in the compositions may vary considerably and depends upon the manner in which the dispersion of composition in vehicle is to be applied and the kind of vehicle used. Generally, from 0.2 to 20 parts by weight of solids per part by weight of vehicle will be used to produce a dispersion of the desired consistency. Preferred dispersions contain 30–75% vehicle.

As indicated above, the compositions of the present invention are printed onto ceramic substrates, after which the printed substrate is fired to mature (sinter) the metallizing compositions of the present invention, thereby forming continuous conductors and coherent dielectrics. Although considerable advantage is afforded in the present invention where the electrode and dielectric compositions are printed on ceramics and cofired, this invention is not limited to that embodiment. The compositions may be printed and individually fired (cured) prior to application of the next sequential layer, if so desired.

The dielectric substrate used in the present invention to make multilayer capacitors may be any dielectric compatible with the electrode composition and firing temperature selected, according to principles well established in the art. Such dielectrics include alumina, barium titanate, barium zirconate, lead zirconate, strontium titanate, calcium titanate, calcium zirconate, lead zirconate, lead zirconate titanate, etc.

The firing temperatures employed to sinter the electrodes and dielectrics, and to partially crystallize the second dielectric sub-layer, sub-layer (B), are chosen according to the composition employed in accordance with principles generally known to the art. Normally a low temperature heat treatment (e.g., 100°–150°C.) is employed to dry the printed pattern and drive off printing solvent. Thereafter, sintering (curing or firing to produce continuous electrodes or dielectrics) is conducted at elevated temperatures (e.g., 850°–950°C.), in either a belt furnace or a box furnace. The temperature is selected based on the thermal characteristics of the material to be sintered; for example, when an electrode is employed the firing temperature is below the melting point of the metal, since melting would result in electrode discontinuity or loss of definition of the printed pattern. Various layers, if desired, may be cofired, provided they are dried between printing steps.

The following examples and comparative showings are presented to illustrate the advantages of the present invention. In the examples and elsewhere in the specification and claims, all parts, percentages, proportions, etc., are by weight, unless otherwise stated.

Capacitance and dissipation factor were determined by mounting the fired multilayer capacitors in the jaws of an automatic RLC Bridge (General Radio Model No. 1683), from which both capacitance and D.F. were automatically read.

Dielectric constant was determined from the capcitance, as follows:

$$K = C \times t/(0.224 \times A)$$

where t and A are thickness and area of the dielectric, respectively, in inches.

EXAMPLES 1–10

Figure 2:
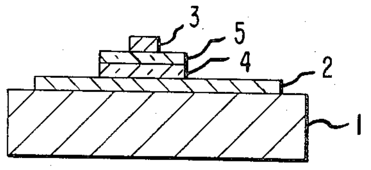
Figure 1:
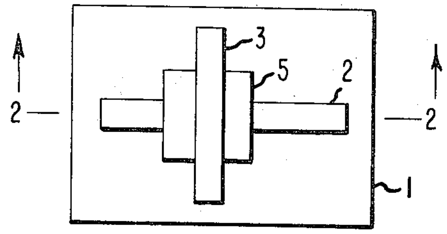

Thick-film multilayer structures were obtained by printing the following pastes in the order indicated, on prefired 96 percent alumina substrates: a bottom electrode composition, two dielectric layers, and a top electrode, in the configuration of FIG. 1 hereof.

Inorganic powders, sufficiently finely divided to pass through a No. 325 screen, were dispersed in a vehicle of 10 percent ethyl allulose and 90 percent beta-terpineol. The solids vehicle ratio was 7/3. All compositions were printed through a No. 200 screen.

Table IV sets forth the nature of the electrodes used in each of Examples 1–10. Where Pd/Ag electrodes were used, there were 2–3 parts of Ag per part of Pd, and the electrode solids contained about 10–20 percent inorganic binder (glass and/or $Bi_2O_3$). The gold electrode composition of Examples 7–9 contained about 5 percent binder on a solids basis.

The composition of the glasses used in the bottom dielectric layer is set forth in Table III. Glasses 1–4 of Table III were used in Examples 1–4 of Table IV, respectively, without any addition of a second free silica phase. Glass 5 of Table III was used in the bottom dielectric layer of Examples 5–10, with the amount of free silica indicated in Table IV; the free silica was amorphous. The crystallizable glasses used in the top dielectric layer in Examples 1–10 were the following (see Table IV): Top dielectric crystallizable Glass A contained 30% $SiO_2$, 10% $TiO_2$, 26% BaO, 10% $Al_2O_3$, 12% ZnO, 2% MgO, 4% $B_2O_3$ and 6% CaO. Crystallizable Glass B contained 27% $SiO_2$, 12% $TiO_2$, 8% BaO, 11% $Al_2O_3$, 10% ZnO, 32% PbO.

After each layer was printed it was dried at 125°C. for 10 minutes. In each example the bottom electrode was fired after it was dried by placing it in a box furnace at 500°C. for 5 minutes, and then in an oven at 850°C. for 10 minutes. In examples 1–4, the dielectric and top electrode were each fired individually as was the bottom electrode. In Examples 5–10, the dielectric and top electrode were cofired in a box furnace as follows: in Examples 5 and 9, at 850°C. for 10 minutes; in Example 10, at 890°C. for 10 minutes. In Examples 6–8, firing was conducted in a belt furnace, total residence time of about an hour, with 10 minutes at a peak temperature of 850°C.

TABLE III

| Component | Glasses used in Examples Amount of component in Glass No. 1 | 2 | 3 | 4 | 5 |
|---|---|---|---|---|---|
| $SiO_2$ | 66 | 62 | 60 | 62 | about 70 |
| $Al_2O_3$ | 10 | 12 | 10 | 10 | — |
| CaO | 10 | 10 | 10 | 10 | — |
| $B_2O_3$ | 10 | 10 | 15 | 13 | about 30 |
| $K_2O$ | 0.5 | 1.5 | 1.0 | 1.0 | — |
| $Na_2O$ | 1.0 | 2.5 | 2.0 | 2.0 | — |
| MgO | 2.5 | 2 | 2 | 2.0 | — |

Table IV indicates in addition to the materials in Examples 1–10, the results obtained with various dielectric structures of the present invention. Appearance is a quantitative judgement of the degree of cracking, interaction of top electrode with the dielectric (sinking, etc.), and peeling.

TABLE IV

| Compositions | Example No. 1 | 2 | 3 | 4 | 5 | 6 | 7 | 8 | 9 | 10 |
|---|---|---|---|---|---|---|---|---|---|---|
| Dielectric Layers: Bottom | Glass 1 | Glass 2 | Glass 3 | Glass 4 | 90 Glass 5 10 Silica | 80 Glass 5 20 Silica | 80 Glass 5 20 Silica | 80 Glass 5 20 Silica | 70 Glass 5 30 Silica | 60 Glass 5 40 Silica |
| Top | Glass A | Glass A | Glass A | Glass A | Glass A | Glass A | Glass A | Glass B | Glass A | Glass A |
| Electrodes Used | Pd/Ag | Pd/Ag | Pd/Ag | Pd/Ag | Pd/Ag | Pd/Ag | Au | Au | Au | Pd/Ag |
| Electrical Properties (at 1 K Hertz): | | | | | | | | | | |
| K | 7.5 | 7.0 | 6.5 | 7.5 | 7.6 | 6.8 | 6.0 | 6.5 | 5.2 | 5.1 |
| DF (%) | 0.55% | 0.9% | 0.8% | 0.8% | 0.2% | 0.03% | 0.05% | 0.16% | 0.1% | 0.0% |
| Appearance | Good | Good | Good | Good | Fair-Good | Fair-Good | Excellent | Excellent | Excellent | Excellent |

Showings A and B

The procedure of Examples 1–10 was repeated, using two layers of crystallizable Glass A in Showing A, and two layers of borosilicate Glass 5 (Table I) in showing B (no silica additions were used). The electrodes were those used in Example 1. In Showing A, the resultant fired structure had a dielectric constant which was too high (B). The fired product of Showing B was also unsatisfactory, since it peeled and cracked; no electrical measurements could be made.

I claim:

1. In multilayer electronic structures comprising as sequential layers on a ceramic substrate a bottom electrode on and adherent to said substrate, a dielectric layer over and adherent to at least part of said bottom electrode, and a top electrode over and adherent to at least part of said dielectric layer, improved multilayer structures wherein said dielectric layer comprises two sub-layers, (A) a sub-layer adjacent to the bottom electrode which comprises 5–100 percent of a borosilicate glass, which glass comprises at least 55% $SiO_2$ and at least 5% $B_2O_3$, the remainder of the borosilicate glass being one or more other glass-forming compounds, and as a separate phase 0–95 percent free $SiO_2$ and adherent to (A), (B) a dielectric sub-layer adjacent to the top electrode, a glass-ceramic containing at least 20 percent crystals dispersed in a glassy matrix.

2. Multilayer structures according to claim 1 wherein dielectric sub-layer (A) comprises at least 60% $SiO_2$ and at least 10% $B_2O_3$.

3. Multilayer structures according to claim 1 wherein dielectric sub-layer (A) additionally comprises about 10–30 percent by weight $SiO_2$ as a separate phase.

4. Multilayer structures according to claim 2 wherein dielectric sub-layer (A) additionally comprises about 10–30% by weight $SiO_2$ as a separate phase.

5. Multilayer structures according to claim 1 wherein dielectric sub-layer (B) is a fired glass-ceramic composition of a glass consisting essentially of (by weight):

20–38% $SiO_2$
21–45% PbO
1–25% $Al_2O_3$
2–20% $TiO_2$
2–15% BaO
0–25% ZnO
0–15% $PbF_2$
0–5% SrO
0–5% $ZrO_2$
0–5% $Ta_2O_5$
0–5% $WO_3$
0–5% CdO
0–5% $SnO_2$
0–5% $Sb_2O_3$

6. Multilayer structures according to claim 1 wherein dielectric sub-layer (B) is a fired glass-ceramic composition of a glass consisting essentially of (by weight):

22–32% $SiO_2$
22–42% PbO
9–13% $Al_2O_3$
3–15% $TiO_2$
4–12% BaO
0–20% ZnO
0–10% $PbF_2$
0–4% SrO
0–4% $ZrO_2$
0–4% $Ta_2O_5$
0–4% $WO_3$
0–4% CdO
0–4% $SnO_2$
0–4% $Sb_2O_3$

7. Multilayer structures according to claim 1 wherein dielectric sub-layer (B) is a fired glass-ceramic composition of a glass consisting essentially of (by weight):

25–40% $SiO_2$
5–15% $TiO_2$
7–12% $Al_2O_3$
10–30% BaO
10–26% ZnO
2–10% CaO
2–8% $B_2O_3$
0–2% MgO
0–4% $Bi_2O_3$ the total of BaO and ZnO being 30–40 percent of the glass composition.

8. Multilayer structures according to claim 1 wherein dielectric sub-layer (B) is a fired glass-ceramic composition of a glass consisting essentially of (by weight):

30–33% $SiO_2$
8–10% $TiO_2$
10–12% $Al_2O_3$
12–26% BaO
10–26% ZnO
6–10% CaO
2–8% $B_2O_3$
0–2% MgO
0–4% $Bi_2O_3$

9. Multilayer structures according to claim 1 wherein dielectric sub-layer (B) is a fired glass-ceramic composition of a glass consisting essentially of (by weight):

30% $SiO_2$
8–10% $TiO_2$
10% $Al_2O_3$
26% BaO
10–12% ZnO
6–10% CaO
4% $B_2O_3$
2% MgO

* * * * *